US012640226B2

(12) United States Patent
Chen

(10) Patent No.: US 12,640,226 B2
(45) Date of Patent: May 26, 2026

(54) SYSTEM AND METHOD FOR TESTING MEMORY

(71) Applicant: NANYA TECHNOLOGY CORPORATION, New Taipei city (TW)

(72) Inventor: Chien Yu Chen, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 158 days.

(21) Appl. No.: 18/496,427

(22) Filed: Oct. 27, 2023

(65) Prior Publication Data

US 2025/0140335 A1    May 1, 2025

(51) Int. Cl.
*G11C 29/56*　　　(2006.01)
*G06T 7/00*　　　(2017.01)

(52) U.S. Cl.
CPC ...... *G11C 29/56016* (2013.01); *G06T 7/0004* (2013.01); *G11C 29/56004* (2013.01); *G06T 2207/30148* (2013.01); *G11C 2029/5604* (2013.01)

(58) Field of Classification Search
CPC ........ G11C 29/56016; G11C 29/56004; G11C 2029/5604; G11C 29/44; G11C 29/56008; G06T 7/0004; G06T 2207/30148
See application file for complete search history.

(56) References Cited

U.S. PATENT DOCUMENTS

| | | | |
|---|---|---|---|
| 2006/0267577 A1* | 11/2006 | Erez ................. | G11C 29/56008 324/759.03 |
| 2008/0159539 A1* | 7/2008 | Huang ................. | H04L 9/0866 380/28 |
| 2011/0193585 A1 | 8/2011 | Co et al. | |
| 2013/0275073 A1* | 10/2013 | Arnold ............... | G01R 31/2834 702/108 |

* cited by examiner

*Primary Examiner* — Mohammed A Bashar

(74) *Attorney, Agent, or Firm* — CKC & Partners Co., LLC

(57) ABSTRACT

A system is provided. The system comprises test devices, a transport device and a data processing device. The test devices perform tests different from each other to a memory device and output test results of the tests. The transport device transports the memory device to the test devices and comprises a first storage device. The first storage device stores the test results and a list of a part of test devices that have tested the memory device. The data processing device stores fabrication data of the memory device. When the transport device determines that the memory device is defective according to at least one of the test results, the data processing device generates a report according the at least one of the test results and the fabrication data.

20 Claims, 5 Drawing Sheets

100 data processing device 130 transport device 110 test device 120

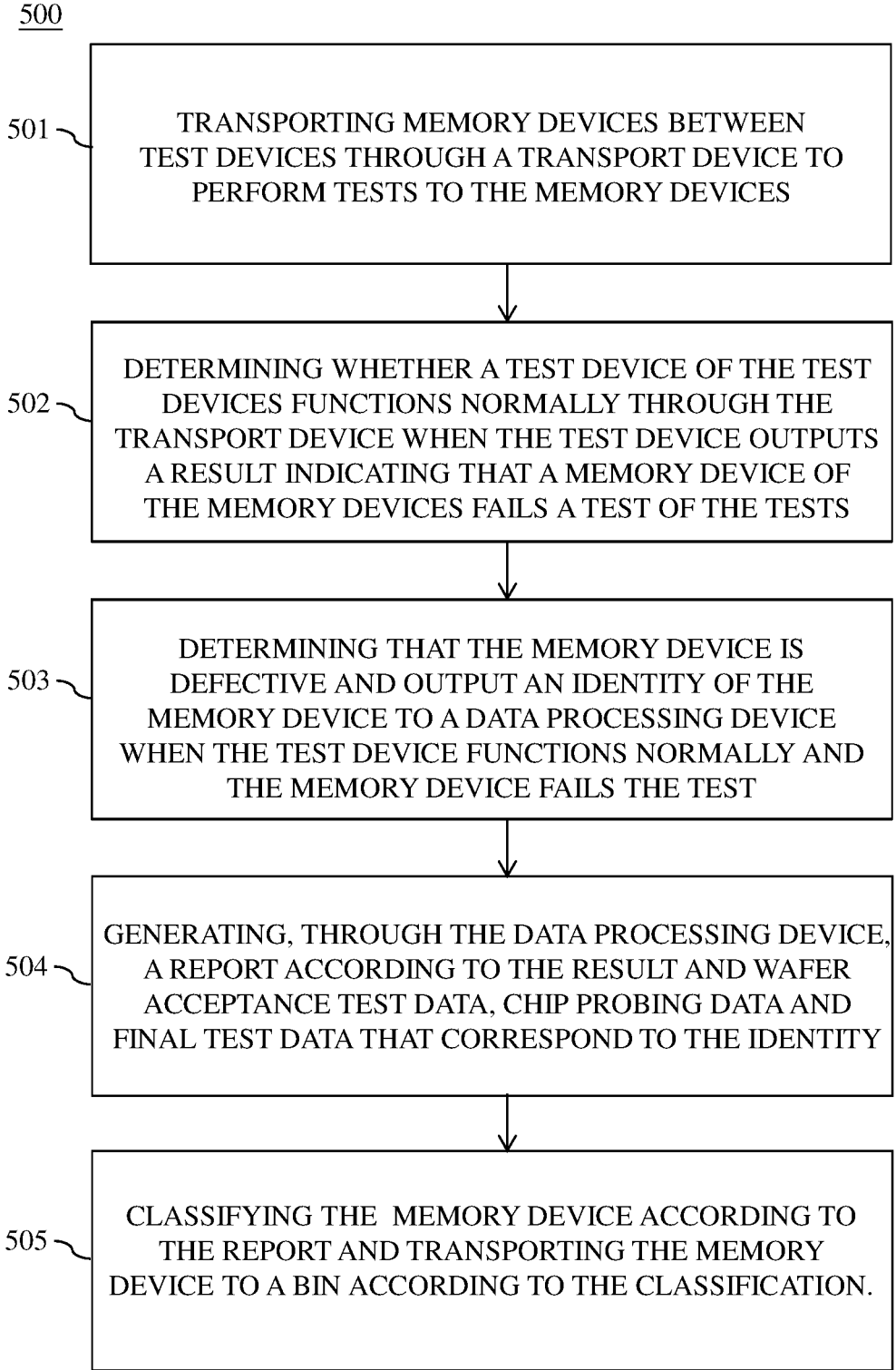

500

501 — TRANSPORTING MEMORY DEVICES BETWEEN TEST DEVICES THROUGH A TRANSPORT DEVICE TO PERFORM TESTS TO THE MEMORY DEVICES

502 — DETERMINING WHETHER A TEST DEVICE OF THE TEST DEVICES FUNCTIONS NORMALLY THROUGH THE TRANSPORT DEVICE WHEN THE TEST DEVICE OUTPUTS A RESULT INDICATING THAT A MEMORY DEVICE OF THE MEMORY DEVICES FAILS A TEST OF THE TESTS

503 — DETERMINING THAT THE MEMORY DEVICE IS DEFECTIVE AND OUTPUT AN IDENTITY OF THE MEMORY DEVICE TO A DATA PROCESSING DEVICE WHEN THE TEST DEVICE FUNCTIONS NORMALLY AND THE MEMORY DEVICE FAILS THE TEST

504 — GENERATING, THROUGH THE DATA PROCESSING DEVICE, A REPORT ACCORDING TO THE RESULT AND WAFER ACCEPTANCE TEST DATA, CHIP PROBING DATA AND FINAL TEST DATA THAT CORRESPOND TO THE IDENTITY

505 — CLASSIFYING THE MEMORY DEVICE ACCORDING TO THE REPORT AND TRANSPORTING THE MEMORY DEVICE TO A BIN ACCORDING TO THE CLASSIFICATION.

FIG. 5

SYSTEM AND METHOD FOR TESTING MEMORY

BACKGROUND

Field of Invention

The present invention relates to system and method for testing memory. More particularly, the present invention relates to system and method for testing memory with a transport device and a data processing device.

Description of Related Art

With the rapidly developed technologies of manufacturing processes of memory devices, memory devices are designed smaller and have circuits with high density. Increasing density of circuits results in benefits in terms of speed and functionality, but errors and fabrication issues are projected to increase. It is usually necessary to test a memory device to confirm the product reliability and the yield.

SUMMARY

In some embodiments, a system is provided. The system comprises test devices, a transport device and a data processing device. The test devices perform tests different from each other to a memory device and output test results of the tests. The transport device transports the memory device to the test devices and comprises a first storage device. The first storage device stores the test results and a list of a part of test devices that have tested the memory device. The data processing device stores fabrication data of the memory device. When the transport device determines that the memory device is defective according to at least one of the test results, the data processing device generates a report according the at least one of the test results and the fabrication data.

In some embodiments, the transport device further comprises a camera. The camera captures an image of a first test device of the test devices. In response to a first test result of the test results indicating that the memory device fails a first test of the tests, the transport device determines whether the first test device or the memory device is defective according to the image.

In some embodiments, when the transport device determines that the memory device is defective, the transport device transports the memory device to an identity read device. The identity read device recognizes an identity of the memory device and outputs the identity to the data processing device. The data processing device retrieves the fabrication data from a second storage device of the data processing device to generate the report.

In some embodiments, the data processing device generates the report with location data of a chip in the memory device, the location data indicating a location of the chip on a wafer corresponding to the identity.

In some embodiments, when the memory device is defective, the data processing device records the memory device in a list of failed memory devices and determine commonalities among fabrication data of the failed memory devices.

In some embodiments, when the memory device is defective, the data processing device estimates a cause of a defect of the memory device according to the commonalities.

In some embodiments, the fabrication data comprises wafer acceptance test data, chip probing data and final test data, the final test data indicating a test result of a packaged chip in the memory device.

In some embodiments, the transport device transports the memory device to each of the plurality of test devices to perform a corresponding one of the tests according to the list.

In some embodiments, a system is provided. The system comprises a first test device, a transport device and a data processing device. The first test device performs read and write operations to a first memory device to perform a first test to the memory device. The transport device places the first memory device on a test platform of the first test device. The data processing device stores a first identity of the first memory device and fabrication data corresponding to the identity and generates a report according to the first test and the fabrication data.

In some embodiments, the transport device outputs the first identity and a test result of the first test to the data processing device to generate the report.

In some embodiments, when the first test device finishes the first test, the transport device retrieves the first memory device from the first test device and removes a second identity of the first test device from a first list. The first list records identities of test devices that have not tested the first memory device.

In some embodiments, the system further comprises a second test device performing a second test to the first memory device. The transport device transports the first memory device from the first test device to the second test device according to the first list.

In some embodiments, the transport device records the first test in a second list when the first test device outputs a first test result indicating that the first memory device fails the first test, and records the second test in the second list when the second test device outputs a second test result indicating that the first memory device fails the second test.

In some embodiments, the transport device determines whether the first test device functions abnormally through a camera.

In some embodiments, when the first test device functions normally and outputs a first test result indicating that the first memory device fail the first test, the transport device estimates the first memory device to be defective.

In some embodiments, the first test device performs the first test to a plurality of second memory devices and the data processing device stores a list. When the transport device estimates a tested second memory device of the plurality of second memory devices to be defective, the data processing device records the tested second memory device in the list. The data processing device generates a yield of the plurality of second memory devices according to the list.

In some embodiments, the data processing device stores wafer acceptance test data, chip probing data and final test data of the plurality of second memory devices. The data processing device determines commonalities among defective memory devices in the plurality of second memory devices according to the wafer acceptance test data, the chip probing data, the final test data and the list.

In some embodiments, a method is provided. The method comprises: transporting memory devices between test devices through a transport device to perform tests to the memory devices; determining whether a first test device of the test devices functions normally through the transport device when the first test device outputs a result indicating that a first memory device of the memory devices fails a first test of the tests; determining that the first memory device is defective and output an identity of the first memory device to a data processing device when the first test device functions normally and the first memory device fails the first test; and generating, through the data processing device, a report according to the result and wafer acceptance test data, chip probing data and final test data that correspond to the identity.

In some embodiments, determining whether the test device functions abnormally comprises: capturing an image of the first test device by a camera of the transport device; and determining whether the test device functions abnormally according to the image.

In some embodiments, the method further comprises: transporting the first memory device to an identity read device to read the identity stored in the first memory device when the first memory device is defective; outputting the identity to the data processing device through the identity read device to record that the first memory device is defective.

BRIEF DESCRIPTION OF THE DRAWINGS

The invention can be more fully understood by reading the following detailed description of the embodiment, with reference made to the accompanying drawings as follows:

FIG. 5 is flowchart of a method 500 in accordance with some embodiments of the present disclosure.

DETAILED DESCRIPTION

Figure 1:
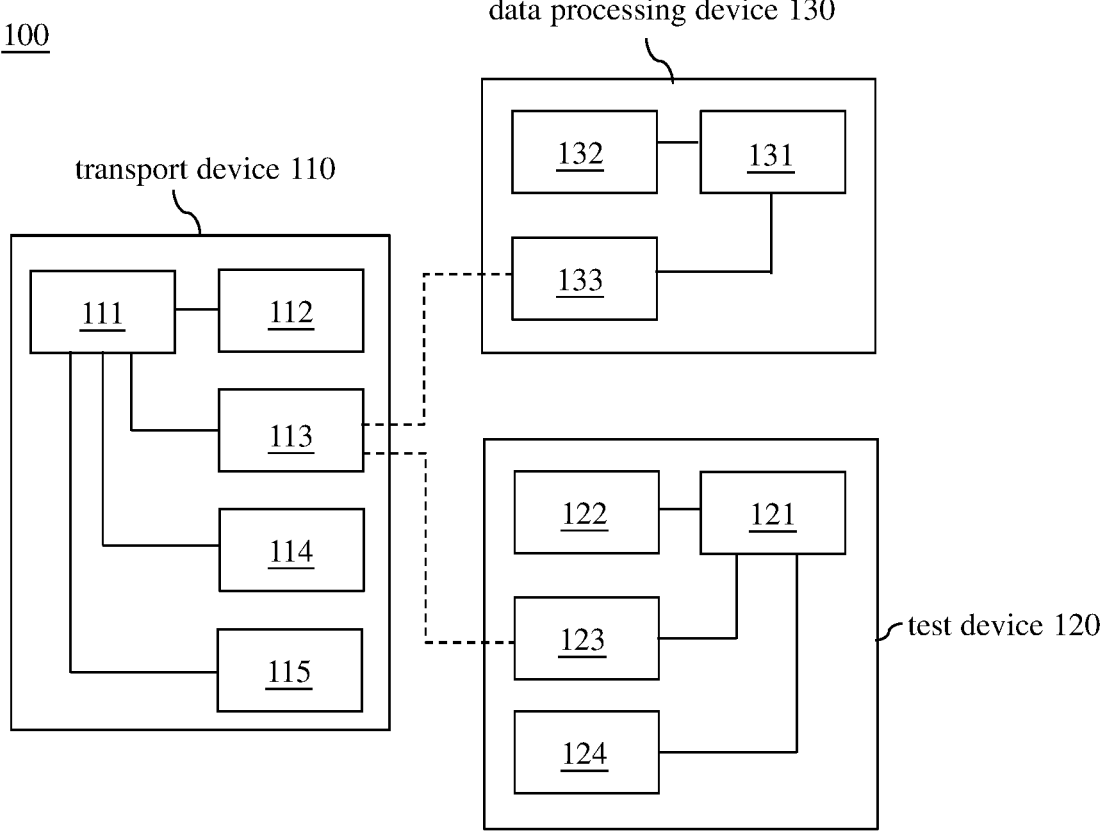
FIG. 1 is a schematic diagram of a system in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

As used herein, the terms "comprising," "including," "having," "containing," "involving," and the like are to be understood to be open-ended, i.e., to mean including but not limited to.

Reference throughout the specification to "one embodiment," "an embodiment," or "some embodiments" means that a particular feature, structure, implementation, or characteristic described in connection with the embodiment(s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, the term "and/or" includes any and all combinations of one or more of the associated listed items.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Figure 2:
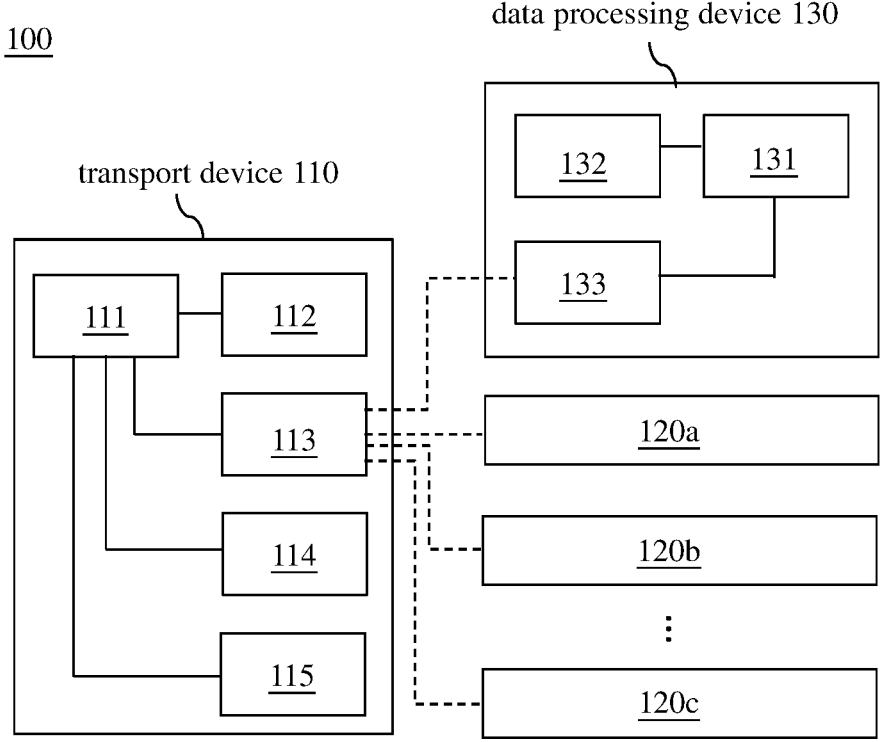
FIG. 2 is a schematic diagram of a system according to the system in FIG. 1 in accordance with some embodiments of the present disclosure.

Reference is now made to FIGS. 1 and 2. In accordance with some embodiments of the present disclosure, FIGS. 1 and 2 depict a schematic diagram of a system 100. For illustration, the system 100 includes a transport device 110, a test device 120 and a data processing device 130.

According to some embodiments of the present disclosure, the transport device 110 is a mobile machine/robot for transporting a memory device (e.g., a static random-access memory (SRAM) chip or dynamic random-access memory (DRAM) chip) to the test device 120. In some embodiments, when the test device 120 finishes testing the memory device, the data processing device 130 generate a report according to a test result outputted by the test device 120. Further detail would be described in the following paragraphs.

As shown in FIG. 1, in some embodiments, the transport device 110 includes a processor 111, a storage device 112, a communication device 113, a camera 114 and a robotic arm 115. The processor 111 is coupled to storage device 112, the communication device 113, the camera 114 and the robotic arm 115.

The test device 120 includes a processor 121, a test platform 122, a communication device 123 and a display device 124. The processor 121 is coupled to the test platform 122, the communication device 123 and the display device 124. The communication device 113 is connected to the communication device 123 by establishing a communication.

The data processing device 130 includes a processor 131, a storage device 132 and a communication device 133. The processor 131 is coupled to the storage device 132 and the communication device 133. The communication device 113 is connected to the communication device 133 by establishing a communication.

In some embodiments, the test devices 120 are programmable test machine for testing the memory device. In some embodiments, the test devices 120 include computers, tablets, smart phones, or any suitable electronic device operating with the memory devices.

In some embodiments, to perform a test to the memory device, the transport device 110 transports the memory device to the test device 120 and places the memory device on the test platform 122 of the test device 120. In some embodiments, the transport device 110 places the memory device on the test platform 122 with the robotic arm 115 to operatively couple the memory device to pins of the test platform 122. Then, the test device 120 performs the test with the memory device coupled to the test device 120.

In some embodiments, the test device 120 performs the test when operating with the memory device. During the test, the test device 120 repeats performing one operation for a period of time. In some embodiments, when the test device 120 fails to perform the operation correctly, the processor 121 determines that the memory device fails the test. In practice, the operation repeatedly performed in the test may be, for example, a sleep operation, a reboot operation, an idle operation, a memory read/write operation, a 3D scene rendering operation, and so on.

In some embodiments, when the test device 120 finishes the test, the test device 120 outputs a test result to the transport device 110. In some embodiments, the test result indicates whether the memory device pass the test. For example, when the test device 120 determines that the memory device fails the test, the test device 120 outputs the test result indicating the failing to the transport device 110.

According to some embodiments, when the transport device 110 receives the test result indicating that the memory device fails the test, the transport device 110 determines whether the test device 120 functions abnormally or the memory device is defective.

In some embodiments, the camera 114 captures an image of the test device 120 and the processor 111 determines whether the test device 120 functions abnormally according to the image. When the processor 111 detects an abnormal condition in the image, the processor 111 determines that the test device 120 functions abnormally. According to various embodiments, the abnormal condition may be false connection of cables/wires, structural damage of hardware, the test platform covered by foreign matter like dust, and so on. In some embodiments, the processor 111 determines that the test device 120 functions abnormal when the display device 124 is blank or blurred.

In some embodiments, the robotic arm 115 is further used to determine whether the test device 120 functions abnormally. For example, the robotic arm 115 examines a torque value of a valve that is used to hold the memory device. When the torque value is not in a predetermined range, the processor 111 determines that the test device 120 functions abnormally. In some embodiments, the robotic arm 115 examines a depth of a screw. Similarly, when the depth is not in a predetermined range the processor 111 determines that the test device 120 functions abnormally.

According to some embodiments, when the test device 120 functions abnormally, the robotic arm 115 is further used to fix the test device 120. For example, the robotic arm 115 tightens the screw until the depth of the screw is in the predetermined range. In some embodiments, after the robotic arm 115 fixes the test device 120, the transport device 110 controls the test device 120 to perform the test to the memory device one more time.

In some embodiments, when the transport device 110 receives the test result indicating that the memory device fails the test from the test device 120 and the processor 111 determines that the test device 120 functions normally (e.g., finding no abnormal condition in the image), the processor 111 estimates the memory device to be defective.

In some embodiments, the storage device 112 stores the test result and the determination result of whether the test device 120 functions abnormally or the memory device is defective.

In some embodiments, when the test is finished, the transport device 110 outputs an identity (ID) of the memory device, the test result and result of whether the test device functions abnormally or the memory device is defective to the data processing device 130 to store the test result in the storage device 132. In practice, the ID includes a batch number of the memory device.

According to various embodiments, the data processing device further stores IDs of multiple memory devices and fabrication data corresponding to the IDs separately. In some embodiments, the fabrication data includes parameters and processing logs of the wafer fabrication and the packaging process.

In some embodiments, the fabrication data includes wafer acceptance test (WAT) data, chip probing data and final test data. In some embodiments, the WAT data includes test results of basic electrical parameters (e.g., sheet resistance of metal layers) of a wafer. In some embodiments, the chip probing data includes results of chip probing tests that test functions (e.g., read/write) of chips in the memory devices. In some embodiments, the final test data includes results of functional tests to packaged chips of the memory device. In some embodiments, the data rate configured for a final test is faster than the data rate configured for a chip probing test.

In some embodiments, when the processor 111 determines that the memory device is defective, the transport device 110 outputs the identity (ID) of the memory device and the test result to the data processing device 130 to generate a report for determining a cause of the memory device failing the test.

Then, the processor 131 retrieves fabrication data of the memory device from the storage device 132 according to the ID of the memory device. For example, retrieving chip probing data that includes the ID. The processor 131 generates the report according to the ID, the test result and the fabrication data of the memory device.

In some embodiments, the storage devices 112 and 132 include any type of fixed or removable random access memory, read-only memory (ROM), flash memory (Flash memory), or the like element or a combination of the above elements.

As shown in FIG. 2, in some embodiments, the system 100 further includes multiple test devices 120 (annotated as 120a-120c). Each of the test devices 120a-120c is connected to the communication device 113 by establishing a communication.

In some embodiments, the test devices 120a-120c perform tests different from each other. For example, the test device 120a performs the sleep operation test, the test device 120*b* performs the reboot operation test and the test device 120*c* performs the idle operation test.

In order to correctly transport the memory device to each test device 120 (test devices 120*a*-120*c*), the transport device 110 records the test device 120 that have not tested the memory device. In some embodiments, the storage device 112 stores a list recording IDs of the test device 120 that have not tested the memory device. When a test device 120 finishes testing, the processor 111 removes the ID of the test device 120 from the list.

For example, when the test device 120*a* finishes performing the test, the transport device 110 retrieves the memory device from the test device 120*a* and removes the ID of the test device 120*a* from the list. Then, the transport device 110 transports the memory device to the test device 120*b* that is recorded in the list and places the memory device on the test platform 122 of the test device 120*b* to performing the test.

In various embodiments, the storage device 112 stores a list recording IDs of the test device 120 that have tested the memory device to transport the memory device to each test device 120 according to the list.

According to some embodiments, the transport device 110 records the tests that the memory device failed in the storage device 112. For example, when the memory device fails the test of the test device 120*a*, the transport device 110 records the test of the test device 120*a* in a failed test list of the memory device. Similarly, when the memory device fails the test of the test device 120*b*, the transport device 110 records the test of the test device 120*b* in the failed test list of the memory device.

In application, the transport device 110 determines that all tests of the test devices 120 (120*a*-120*c*) are finished when the list is empty in accordance with some embodiments.

In some embodiments, when all the test devices 120 finish testing, the transport device output the ID of the memory device and the test results of the test devices 120 and determinations of whether the memory device is defective for each test/test device 120 to the data processing device 130 to generate the report.

In some embodiments, the data processing device 130 generates the report in response to the transport device 110 determining that the memory device is defective for at least one of the tests of the test devices 120. The data processing device 130 generates the report according to the fabrication data and the test result of the at least one of the tests, for example, the test of the test device 120*a*.

The configurations of FIGS. 1 and 2 are given for illustrative purposes. Various implements are within the contemplated scope of the present disclosure. For example, in some embodiments, the system 100 further includes a display device to display the report generated by the data processing device 130.

Figure 3:
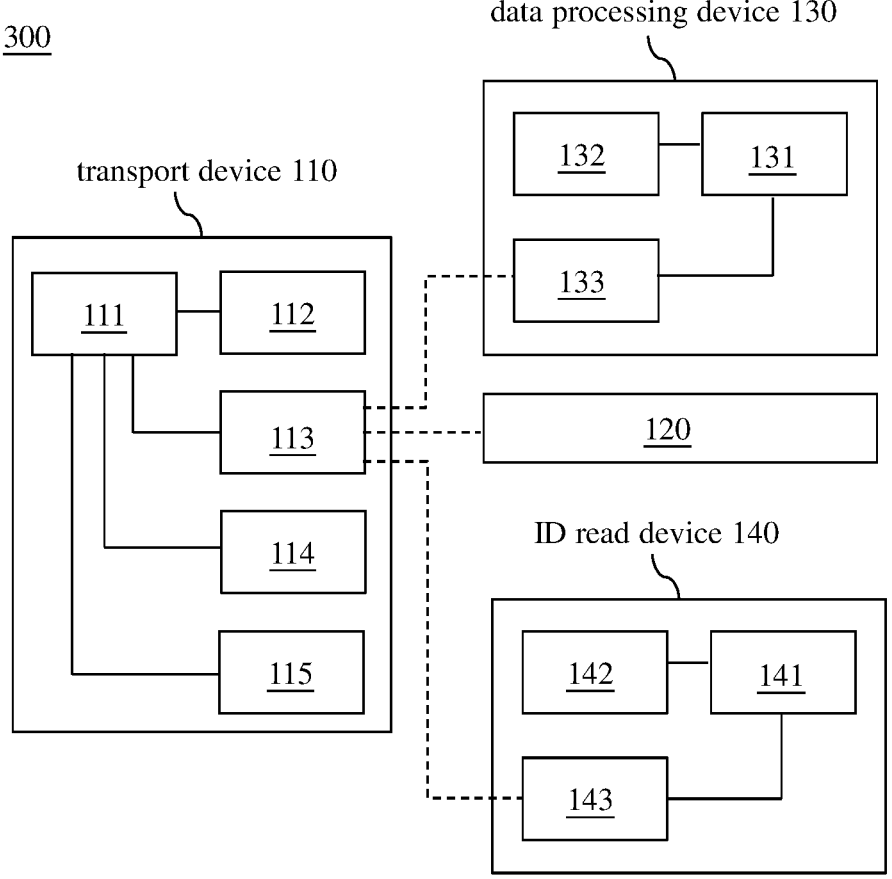
FIG. 3 is a schematic diagram of a system according to the system in FIGS. 1 and 2 in accordance with some embodiments of the present disclosure.

Reference is now made to FIG. 3. In accordance with some embodiments, FIG. 3 depicts a system 300 according to the system 100 in FIGS. 1 and 2. With respect to the embodiments of FIGS. 1 and 2, like elements in FIG. 3 are designated with the same reference numbers for ease of understanding. The specific operations of similar elements, which are already discussed in detail in above paragraphs, are omitted herein for the sake of brevity.

Compared with the system 100 in FIGS. 1 and 2, the system 300 further includes an identity (ID) read device 140. The ID read device 140 is used to recognize the ID of the memory device. In some embodiments, when the transport device 110 determines that the memory device is defective, the transport device 110 transports the memory device to the ID read device 140 to read the ID of the memory device.

As shown in FIG. 3, in some embodiments, the ID read device 140 includes a processor 141, a test platform 142 and a communication device 143. The processor 141 is coupled to the test platform 142 and the communication device 143. The communication devices 113 and 143 are connected to each other through establishing a communication.

In some embodiments, the transport device 110 transports the memory device to the ID read device 140 and places the memory device on the test platform 142. The processor 141 then read the ID stored in the memory device and outputs the ID to the transport device 110. The transport device 110 subsequently outputs the ID and the test results to the data processing device 130 to generate the report.

According to various embodiments, each of the processors 111, 121, 131 and 141 is a central processing unit (CPU), a programmable general-purpose or special-purpose micro control unit (MCU), a microprocessor, a digital signal processor (DSP), a programmable controller, an application specific integrated circuit (ASIC), a graphics processing unit (GPU), an arithmetic logic unit (ALU), a complex programmable logic device (CPLD), a field programmable gate array (FPGA) or other similar components or a combination of the above components.

In some embodiments, the communication devices 113, 123, 133 and 143 include a wireless device based on standard of IEEE 802.11 (e.g., Wi-Fi), Bluetooth, ZigBee, near-field communication (NFC) or any other suitable wireless communication standard. In various embodiments, the communication device 113 includes a device based on standard of Ethernet, universal serial bus (USB) or any other wired communication standard.

The configurations of FIG. 3 are given for illustrative purposes. Various implements are within the contemplated scope of the present disclosure. For example, in some embodiments, the system 300 further includes multiple test devices 120 like the test devices 120*a*-120*c* in FIG. 2.

Figure 4:
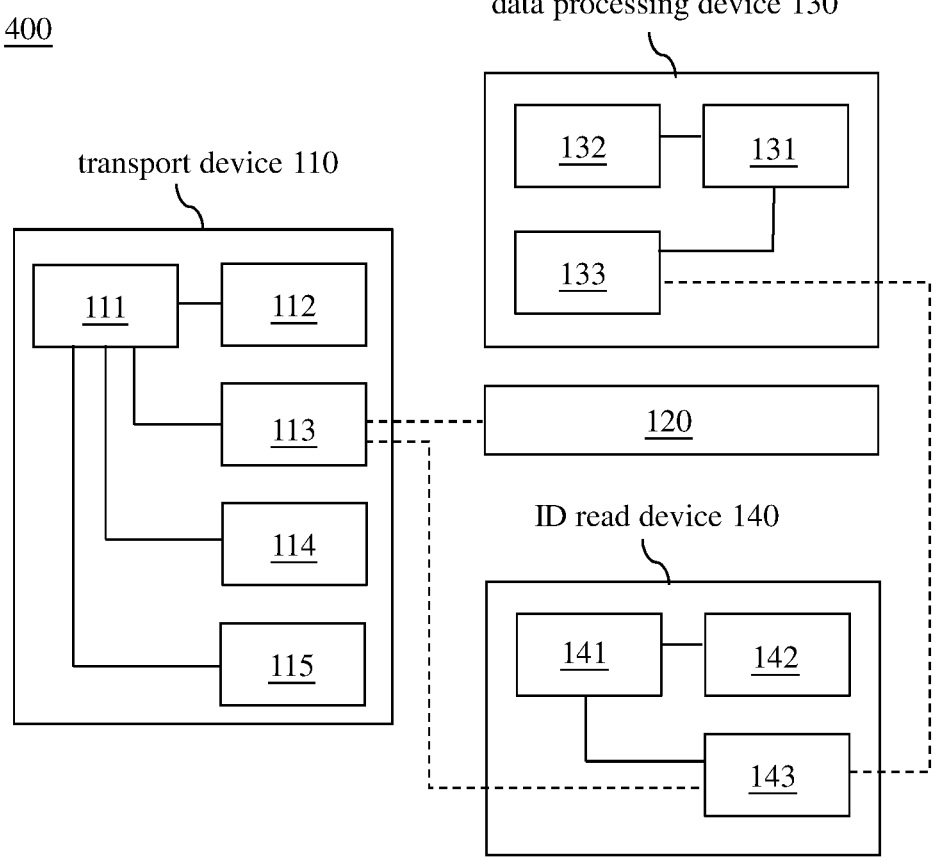
FIG. 4 is a schematic diagram of a system according to the system in FIGS. 1-3 in accordance with some embodiments of the present disclosure.

Reference is now made to FIG. 4. In accordance with some embodiments, FIG. 3 depicts a system 300 according to the system 100 in FIGS. 1-2 and the system 300 in FIG. 3. With respect to the embodiments of FIGS. 1-3, like elements in FIG. 4 are designated with the same reference numbers for ease of understanding. The specific operations of similar elements, which are already discussed in detail in above paragraphs, are omitted herein for the sake of brevity.

Compared with the communication device 133 of the system 300 in FIG. 3, instead of connected to the communication device 113, the communication device 133 of the system 400 is connected to the communication device 143 by establishing a communication.

In some embodiment, when the tests are finished, the transport device 110 transports the memory device to the ID read device 140 and outputs the test results and the determinations of whether the memory device is defective for each test to the ID read device 140. Then, the ID read device 140 read the ID of the memory device.

After the ID is read, the ID read device outputs the ID, the test results and the determinations of whether the memory device is defective for each test to the data processing device 130 through the communication device 143 to generate the report.

The configurations of FIG. 4 are given for illustrative purposes. Various implements are within the contemplated scope of the present disclosure. For example, in some embodiments, the system 400 further includes multiple test devices 120 like the test devices 120*a*-120*c* in FIG. 2.

Reference is now made to FIG. 5. FIG. 5 is flowchart of a method 500 in accordance with some embodiments of the present disclosure. It is understood that additional operations can be provided before, during, and after the processes shown by FIG. 5, and some of the operations described below can be replaced or eliminated, for additional embodiments of the method 500. At least some operations in the method 500 can be utilized to operate the systems 100, 300 and 400 in FIGS. 1-4. The method 500 includes operations 501-504 which would be discussed below.

With reference to FIGS. 1-4. In operation 501, the transport device 110 transports multiple memory devices between the test devices 120 (120a-120c) to perform tests to the memory devices.

In operation 502, the test device 120a performs a first test to a first memory device of the memory devices and outputs a first test result to the transport device 110. When the first test result indicates that the first memory device fails the first test, the transport device 110 determines whether the test device 120a functions normally.

In some embodiments, the camera 114 captures an image of the test device 120a and determines whether the test device 120a functions normally according to the image.

In operation 503, when the test device 120a functions normally and the first memory device fails the first test, the transport device 110 determines that the first memory device is defective and the ID of the first memory device is outputted to the data processing device 130.

In some embodiments, the transport device 110 transport the first memory device to the ID read device 140 to read the ID stored in the first memory device when the first memory device is defective. Then, the ID read device 140 outputs the ID of the first memory device to the data processing device 130 to record that the first memory device is defective.

In operation 504, the data processing device 130 generates the report according to the first test result, WAT data, chip probing data and final test data that correspond to the ID of the first memory device.

In some embodiments, the storage device 132 stores location data of chips of the memory devices on the corresponding wafers. In some embodiments, the data processing device 130 generates the report with location data of the chip of the first memory device according to the ID of the first memory device. The location data indicates the location of the chip on a wafer corresponding to the ID of the first memory device.

In some embodiments, the storage device 132 further stores a memory device list for each test device 120 to generate a yield of the memory devices corresponding to each test device 120. For example, when the first memory fails the test of the test device 120a and is estimated to be defective, the data processing device 130 records the ID of the first memory device in the memory device list corresponding to the test device 120a. The data processing device 130 generates a yield of the memory devices corresponding to the test of the test device 120a according to the memory device list of the test device 120a. For example, the yield is the number of IDs in the memory device list divided by the total number of the memory devices.

In some embodiments, when one of the memory devices is estimated to be defective, the data processing device 130 records the ID of this defective memory device in a defective memory device list stored in the storage device 132. The data processing device 130 determines commonalities among fabrication data of the memory devices recorded in the defective memory device list. For example, the data processing device 130 may determines that the memory devices estimated to be defective for the test device 120a have commonalities in some results of the wafer acceptance test.

In some embodiments, when a memory device is defective, the data processing device 130 estimates a cause of a defect of the memory device according to the commonalities. For example, the data processing device 130 may estimates that a defect of the first memory device is caused by a wafer fabrication process error when the first memory device and defective memory devices with the wafer fabrication process error have commonalities in fabrication data and test results. In some embodiments, the data processing device 130 records the number of the occurrences of each cause and presents the most frequent causes of defect in the report generated by the data processing device 130.

In some embodiments, the first memory device is classified according to the report. For example, when the first memory device is determined defective with a first cause, the transport device 110 transports the first memory device to a first recycle bin. Similarly, when the first memory device is determined defective with a second cause different from the first cause, the transports device 110 transports the first memory device to a second recycle bin.

In some embodiments, at least one second memory device is manufactured according to the report. In some embodiments, the at least one second memory device is manufactured according to the causes in the report. Specifically speaking, for example, the data processing device 130 determines commonalities among the defective memory devices and generates the report indicating that the defective memory devices are packaged by a same packaging machine. Then, the packaging machine is adjusted in response to the report and the at least one second memory device is manufactured after the packaging machine is adjusted.

As described above, the present disclosure provides system and method for testing memory devices. The transport device of the provided system generates determination results of whether the tested memory devices are defective and the data processing device of the system stores the results and generates a report including yield of memory devices, commonalities of the defective memory devices, fabrication data and defect cause analysis. The report helps improve wafer fabrication process, photomask design and circuit design of the memory device.

While the disclosure has been described by way of example(s) and in terms of the preferred embodiment(s), it is to be understood that the disclosure is not limited thereto. Those skilled in the art may make various changes, substitutions, and alterations herein without departing from the spirit and scope of the present disclosure. In view of the foregoing, it is intended that the present invention cover modifications and variations of this invention provided they fall within the scope of the following claims.

What is claimed is:

1. A system, comprising:
   a plurality of test devices configured to perform tests different from each other to a memory device and to output test results of the tests,
   wherein in a first test of the tests, a first test device of the test devices is configured to repeatedly perform a sleep operation, a reboot operation or an idle operation with the memory device coupled to the first test device;
   a transport device that is configured to transport the memory device to the plurality of test devices and comprises:

a first storage device configured to store the test results and a list of a part of the test devices testing the memory device; and a data processing device configured to store fabrication data of the memory device, wherein when the transport device determines that the memory device is defective according to at least one of the test results, the data processing device is further configured to generate a report according the at least one of the test results and the fabrication data.

2. The system of claim 1, wherein the transport device further comprises:

a camera configured to capture an image of a first test device of the plurality of test devices, wherein the transport device is further configured to, in response to a first test result of the test results indicating that the memory device fails a first test of the tests, determine whether the first test device or the memory device is defective according to the image.

3. The system of claim 2, further comprising:

an identity read device, wherein when the transport device determines that the memory device is defective, the transport device transports the memory device to the identity read device, wherein the identity read device recognizes an identity of the memory device and outputs the identity to the data processing device, wherein the data processing device retrieves the fabrication data from a second storage device of the data processing device to generate the report.

4. The system of claim 3, wherein the data processing device is further configured to generate the report with location data of a chip in the memory device, the location data indicating a location of the chip on a wafer corresponding to the identity.

5. The system of claim 3, wherein when the memory device is defective, the data processing device is further configured to record the memory device in a list of failed memory devices and to determine commonalities among fabrication data of the failed memory devices.

6. The system of claim 5, wherein when the memory device is defective, the data processing device is further configured to estimate a cause of a defect of the memory device according to the commonalities.

7. The system of claim 1, wherein the fabrication data comprises wafer acceptance test data, chip probing data and final test data, the final test data indicating a test result of a packaged chip in the memory device.

8. The system of claim 1, wherein the transport device is further configured to transport the memory device to each of the plurality of test devices to perform a corresponding one of the tests according to the list.

9. A system, comprising:

a first test device configured to perform read and write operations to a first memory device to perform a first test to the memory device;

a transport device configured to place the first memory device on a test platform of the first test device, wherein when the first test device indicates that the first memory device fails the first test, the transport device examines a torque value of a valve holding the first memory device to determine whether the first test device functions abnormally; and a data processing device configured to store a first identity of the first memory device and fabrication data corresponding to the identity and generate a report according to the first test and the fabrication data.

10. The system of claim 9, wherein the transport device is further configured to output the first identity and a test result of the first test to the data processing device to generate the report.

11. The system of claim 9, wherein when the first test device finishes the first test, the transport device is further configured to retrieve the first memory device from the first test device and remove a second identity of the first test device from a first list, wherein the first list records identities of test devices that have not tested the first memory device.

12. The system of claim 11, further comprising:

a second test device configured to perform a second test to the first memory device, wherein the transport device is further configured to transport the first memory device from the first test device to the second test device according to the first list.

13. The system of claim 12, wherein the transport device is further configured to record the first test in a second list when the first test device outputs a first result indicating that the first memory device fails the first test, and configured to record the second test in the second list when the second test device outputs a second test result indicating that the first memory device fails the second test.

14. The system of claim 9, wherein the transport device is further configured to determine whether the first test device functions abnormally through a camera.

15. The system of claim 14, wherein when the first test device functions normally and outputs a first test result indicating that the first memory device fail the first test, the transport device estimates the first memory device to be defective.

16. The system of claim 15, wherein the first test device is further configured to perform the first test to a plurality of second memory devices and the data processing device is further configured to store a list, wherein when the transport device estimates a tested second memory device of the plurality of second memory devices to be defective, the data processing device records the tested second memory device in the list, wherein the data processing device is further configured to generate a yield of the plurality of second memory devices according to the list.

17. The system of claim 16, wherein the data processing device is further configured to store wafer acceptance test data, chip probing data and final test data of the plurality of second memory devices, wherein the data processing device is further configured to determine commonalities among defective memory devices in the plurality of second memory devices according to the wafer acceptance test data, the chip probing data, the final test data and the list.

18. A method, comprising:

transporting memory devices between test devices through a transport device to perform tests to the memory devices;

examining a torque value of a valve holding a first memory device of the memory devices to determine whether a first test device of the test devices functions normally through the transport device when the first test device outputs a result indicating that the first memory device fails a first test of the tests;

determining that the first memory device is defective and output an identity of the first memory device to a data processing device when the first test device functions normally and the first memory device fails the first test;

generating, through the data processing device, a report according to the result and wafer acceptance test data, chip probing data and final test data that correspond to the identity; and classifying the first memory device according to the report and transporting the first memory device to a bin according to the classification.

19. The method of claim 18, wherein determining whether the test device functions abnormally comprises:

capturing an image of the first test device by a camera of the transport device; and determining whether the test device functions abnormally according to the image.

20. The method of claim 18 further comprising:

transporting the first memory device to an identity read device to read the identity stored in the first memory device when the first memory device is defective; and outputting the identity to the data processing device through the identity read device to record that the first memory device is defective.

* * * * *